United States Patent [19]

Kamata

[11] Patent Number: 4,868,615
[45] Date of Patent: Sep. 19, 1989

[54] SEMICONDUCTOR LIGHT EMITTING DEVICE USING GROUP I AND GROUP VII DOPANTS

[75] Inventor: Atsushi Kamata, Yokohama, Japan

[73] Assignee: Kabushiki Kaisha Toshiba, Kawasaki, Japan

[21] Appl. No.: 97,166

[22] Filed: Sep. 16, 1987

[30] Foreign Application Priority Data

Sep. 26, 1986 [JP] Japan .................................. 61-227253

[51] Int. Cl.⁴ ........................................... H01L 33/00
[52] U.S. Cl. ....................................... 357/17; 357/16; 357/63; 357/61
[58] Field of Search .................... 357/16, 17, 63, 4, 61, 357/30 B, 30 E, 30 P

[56] References Cited

U.S. PATENT DOCUMENTS

| 3,578,507 | 5/1971 | Chiang | 357/17 X |
| 3,670,220 | 6/1972 | Kun et al. | 357/17 X |
| 4,695,857 | 9/1987 | Baba et al. | 357/16 |
| 4,727,557 | 2/1988 | Burnham et al. | 357/4 X |

FOREIGN PATENT DOCUMENTS

| 4844068 | 12/1973 | Japan | 357/30 E |
| 5630772 | 3/1981 | Japan | 357/30 B |
| 59-6583 | 1/1984 | Japan . | |
| 59-6583 | 1/1984 | Japan . | |
| 60-198738 | 10/1985 | Japan . | |

OTHER PUBLICATIONS

Bleicher, "Group II–VI Compounds in Opto. Electronics", *Funk-Technik*, 31, 20/1976, pp. 644–652.
Park et al, "P-Type Conduction in Li–Dopeb Zn Se", *Applied Physic Letters*, vol. 18, No. 2, 1971, pp. 45–46.
Applied Physics Letters, vol. 18, No. 2, p. 45, 1971, Y. S. Park et al.

*Primary Examiner*—William A. Mintel
*Attorney, Agent, or Firm*—Oblon, Spivak, McClelland, Maier & Neustadt

[57] ABSTRACT

A semiconductor light emitting device is disclosed which comprises a compound semiconductor substrate, an n type $ZnS_xSe_{1-x}$ crystal layer ($0 \leq x \leq 1$) formed on the substrate and containing a Group VII element as a donor impurity, and a p type $ZnS_ySe_{1-y}$ crystal layer ($0 \leq y \leq 1$) formed on the n type crystal layer and containing a Group I element as an acceptor impurity, where a pn junction is formed between the n type crystal layer and the p type crystal layer.

5 Claims, 5 Drawing Sheets

SEMICONDUCTOR LIGHT EMITTING DEVICE USING GROUP I AND GROUP VII DOPANTS

BACKGROUND OF THE INVENTION

1. Field of the Invention

This invention relates to a semiconductor light emitting device having a ZnSSe layer and a method for manufacturing the same.

2. Description of the Prior Art

Among light emitting devices employing Group II-VI compounds, a device using ZnSSe has been considered by many to be a promising blue-emitting device Many attempts have been made to form a light emitting device through the various growth methods, for example, liquid phase epitaxy ion implantation following the annealing, of a ZnSSe crystal. However, no practical device has been achieved using these conventional methods. The main reason for this is that, when an impurity doping is performed in accordance with the conventional method, vacancies are produced, which cancel the effect of such an impurity doping,—known as what is called "self compensation effect"—so that better control cannot be made with respect to the conductivity type.

In the field of the light emitting devices, attention has recently been paid to a metalorganic chemical vapor deposition (MOCVD) method, which is a vapor growth mehtod using organometallic compounds. The process for manufacturing a light emitting diode (LED) and a laser diode (LD) employing Group III-V compounds has reached a stage of practical application. When a ZnSSe crystal is grown on a compound, by means of the MOCVD technique, it has been found that the ZnSSe crystal layer whose lattice parameter is matched to that of GaAs has a specular surface as smooth as that of the substrate, and X-ray diffractometric analysis has shown that it has a better crystallinity (full width at half maximum $<40''$).

It is expected that the MOCVD technique enables crystal growth under the thermally non-equilibrium condition and then suppresses the self-compensation effect at a low growth temperature. Many experiments have been tried to grow a ZnSSe crystal with a pn junction on a GaAs substrate. However, no satisfactory pn junction of ZnSSe has yet been formed even if the MOCVD process is employed. From impurity analysis of ZnSSe crystal it has been found that a greater amount of Ga is diffused from a GaAs substrate through the ZnSSe crystal layer and that the donor and acceptor impurities diffused mutually through the pn junction. It has also been found that light emission intensity related to deep levels increased due to the doping of the donor and acceptor impurities.

As set forth above, while a ZnSSe crystal layer of excellent crystallinity can be formed on the Group III-V compound substrate, by use of the MOCVD method, it has however proven difficult to form a pn junction of better characteristic in the ZnSSe crystal layer.

SUMMARY OF THE INVENTION

An object of this invention is to provide a semiconductor light emitting device having a pn junction of better characteristic in a ZnSSe crystal layer.

Another object of this invention is to provide a method for manufacturing a semiconductor light emitting device as set out above.

In one aspect of this invention, a semiconductor light emitting device is provided which comprises a compound semiconductor substrate, an n type $ZnS_xSe_{1-x}$ crystal layer ($0<X<1$) formed on the compound semiconductor substrate and containing a Group VII element as a donor impurity, and a p type $ZnS_ySe_{1-y}$ crystal layer ($0<y<1$) formed on the n type crystal layer and containing a Group I element as an acceptor impurity, in which a pn junction is formed between the n type $ZnS_xSe_{1-x}$ crystal layer and the p type $ZnS_ySe_{1-y}$ crystal layer.

In another aspect of this invention, a method for manufacturing a semiconductor light emitting device is provided which comprises:

forming an n type $ZnS_xSe_{1-x}$ crystal layer ($0<X<1$) containing a Group VII element as a donor impurity on a compound semiconductor substrate, and forming a p type $ZnS_ySe_{1-y}$ crystal layer ($0<y<1$) containing a Group I element as an acceptor impurity on the n type $ZnS_xSe_{1-x}$ crystal layer, to provide a pn junction between the n type $ZnS_xSe_{1-x}$ crystal layer and the p type $ZnS_ySe_{1-y}$ crystal layer.

According to this invention, an n type Group III-V compound semiconductor is used as a compound semiconductor substrate. A GaAs substrate is preferable as a Group III-V compound substrate.

For example, chlorine, bromine and iodine can be listed as Group VII elements which act as donor impurities. If bromine, in particular, is employed as a donor impurity, a high quality crystal can be obtained since the atomic radius of bromine is close to that of Se and hence, lattice strain can be suppressed.

Sodium lithium, potassium, etc. can be used as the Group I acceptor impurities.

In this case, x in the n type $ZnS_xSe_{1-x}$ crystal layer is preferably within a range of 0 to 0.15 and y in the p type $ZnS_ySe_{1-y}$ crystal layer is preferably within a range 0 to 0.25.

According to the method of this invention, the n type $ZnS_xSe_{1-x}$ crystal layer and p type $ZnS_ySe_{1-y}$ crystal layer are formed preferably by means of an MOCVD technique. For example, dimethylselenide, diethylsulfide and dimethylzinc are used as source materials for the manufacture of a ZnSSe crystal. As such use may also be made of various kinds of organic compounds. Furthermore, if a hydride of the Group VI element is employed, the crystal growth can be performed at a low temperature and hence the mutual diffusion of the impurities can be effectively reduced, making it possible to suppress the generation of the crystal defects.

Where, according to the method of this invention, lithium is used as the acceptor impurity and tert-butyllithium (t-BuLi) is used as an impurity source, an inert gas may be preferably employed as a carrier gas for transporting the t-BuLi to a reaction chamber. That is, where $H_2$ is employed as the carrier gas, the t-BuLi reacts with $H_2$ and is gradually decomposed within a container. For this reason, the carrier concentration of the p type $ZnS_ySe_{1-y}$ crystal layer becomes unstable so that the p type conductivity is gradually lowered to cause it to be turned into an n type conductivity soon. With the inert gas employed as the carrier gas, it is possible to prevent the t-BuLi from being decomposed. Thus the carrier concentration of the p type $ZnS_ySe_{1-y}$ crystal layer can be maintained at a stable level. It is preferable to use He, Ar, Ne or $N_2$ as the inert gas.

As set forth above, in order to accomplish a blue light emitting device, it is necessary to suppress the self-compensation effect, as well as to suppress the effect of diffusion on a substrate-to-ZnSSe interface and pn junction. According to this invention these matters are achieved. That is, if the Group VII element is employed as a donor impurity in the formation of the n type ZnSSe crystal layer, it occupies the position of the Group VI lattice site, and has no relation to the amount of Zn supplied, the generation of the Zn vacancy can be suppressed effectively with an increasing supply of the Zn source material.

In this connection, it should be noted that, if the Group III element is employed as the donor impurity, a Zn vacancy is liable to be generated because the Group III element occupies, in competition with Zn, the Zn site. Since, in this case, it is difficult for the Group III element to occupy the Zn site with the increasing supply of Zn source material, it is necessary to increase the amount of Group III element. If however, the amount of Group III element is increased, it brings about an unexpected reaction and hence involves a risk of yielding more Zn vacancies.

The same applies equally to the case where the Group I element is employed as the acceptor impurity. That is, when the Group V element is employed as the acceptor impurity, it occupies the Group VI position in competition with the Group VI element, thus being liable to produce a Group VI vacancy acting as the donor. If, therefore, the Group I element is used as an acceptor impurity, it occupies the Zn position. Even if, in this case, the supply of Group VI element is increased, the occupancy of the Group I element at the site of the Group II element is not influenced, thus enabling the generation of the Group VI vacancy to be more effectively suppressed.

Where a compound semiconductor substrate is comprised of a Group III-V compound semiconductor, such as GaAs, in order to prevent Ga in the substrate from diffusing into an overlying ZnSSe layer and occupying the Zn position, it is preferable that the number of Zn vacancies in the ZnSSe layer is reduced as small as possible. To this end, it is preferred that a crystal is grown on the substrate initially under the excess Zn condition. In this regard, the method according to this invention for growing an n type ZnSSe crystal layer on the n type substrate is effective. Where the ZnSSe crystal layer is grown under the excess Zn condition to suppress the diffusion of Ga into the Zn position, then the Group VI vacancy is liable to be produced. Since the Group VI vacancy provides a donor defect within the ZnSSe crystal, it is impossible to form the p type layer, if being initially achieved, because Group VI vacancies compensate the acceptor impurity.

With the light emitting device of this invention, it is possible to suppress the mutual diffusion of impurities through the pn junction within the ZnSSe crystal layer. That is, as the Group VII element which occupies the Group VI site is used as the donor impurity, the Group VII element cannot easily diffuse into the p type ZnSSe crystal layer where the generation of the Group VI vacancy is suppressed. Similarly, with the Group I element as the acceptor impurity, it too cannot easily diffuse into the n type ZnSSe crystal layer, where the generation of the Zn vacancy is suppressed.

DETAILED DESCRIPTION OF THE PREFERRED EMBODIMENTS

Examples of this invention will be explained below in more detail.

EXAMPLE 1

An n type $ZnS_xSe_{1-x}$ crystal layer (x=0.05) was grown by the MOCVD method on an Si-doped n type GaAs substrate, and a p type $ZnS_ySe_{1-y}$ crystal layer (y=0.05) was successively grown by the MOCVD method on the resultant substrate structure. In this Example, as the source material for the ZnSSe crystal growth use was made of dimethylzinc (DMZn), dimethylselenide (DMSe) and diethylsulfide (DES); as a donor impurity material, hydrogenchloride (HCl); and as an acceptor impurity material, tertiarybutyllithium (t-BuLi). The following Table shows the growth conditions and the characteristics of the n and p type ZnSSe crystal layers.

TABLE

|  | n type layer | p type layer |
|---|---|---|
| DMSe supply | $3.04 \times 10^{-5}$ | |
| DES supply | $2.59 \times 10^{-5}$ | |
| DMZn supply | $1.55 \times 10^{-5}$ | |
| Growth temperature | 500° C. | |
| Growth pressure | 1 atm | |
| HCl supply | $1.21 \times 10^{-7}$ | — |
| t-BuLi supply | — | $5 \times 10^{-8}$ |
| Carrier concentration | $1.03 \times 10^{16}$ | $5.3 \times 10^{15}$ |

In Table above, the unit of the material supply is [mol/min] and that of the carrier concentration is [$cm^{-3}$].

Figure 1:
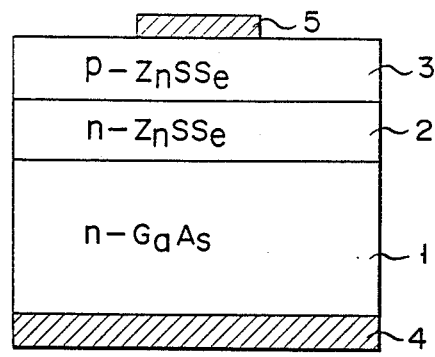
FIG. 1 is a sectional view showing a light emitting device according to one embodiment of this invention.

FIG. 1 is a cross-sectional view showing a light emitting device structure obtained. In FIG. 1 are shown n type ZnSSe crystal layer 2 and p type ZnSSe crystal layer 3 which are formed in that order on n type GaAs substrate 1. Electrode 4 on the n type GaAs substrate 1 was formed of a Au-Ge film and electrode 5 on the p type ZnSSe layer 3 was formed of an Au film.

Figure 2:
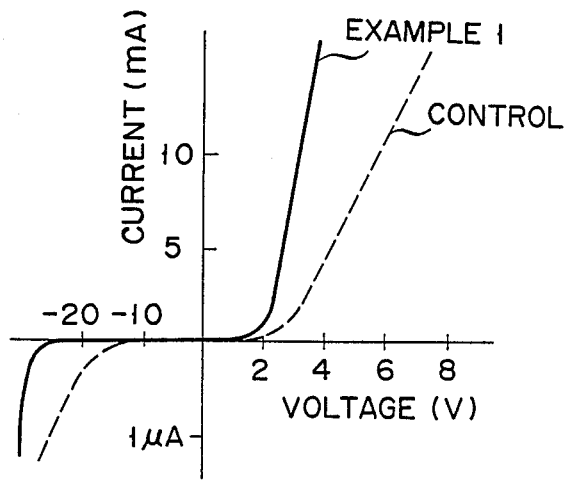
FIG. 2 is a graph showing the voltage-current characteristic of the light-emitting device as shown in FIG. 1.

FIG. 2 is a graph showing the voltage-current characteristic of the light emitting device obtained. The broken line in FIG. 2 shows the voltage-current characteristic of a light emitting device (Control) obtained by growing a p type ZnSSe layer and n type ZnSSe layer in that order on a p type GaAs substrate without varying the growth conditions and impurity doping conditions. As evident from FIG. 2, the light emitting device of Example 1 has a lower rise voltage in a forward direction, a lower series resistance and a higher withstand voltage in a reverse direction than those of Control. In the device of Control, the current-voltage characteristic varies with the lapse of the conduction time, meaning that the device is deteriorated owing to a greater heat value resulting from the series resistance involved.

Figure 3:
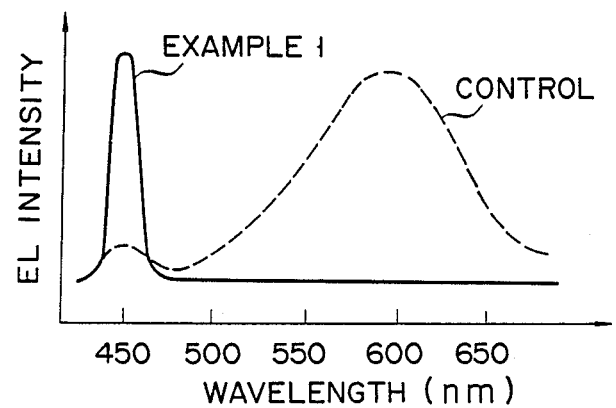
FIG. 3 is a graph showing an electroluminescence (EL) emission spectrum of the light emitting device of FIG. 1.

FIG. 3 shows a comparison in emission spectrum between the device of Example 1 and that of Control. As evident from FIG. 3, a sharp peak is dominant at a blue emitting range in the case of the device of Example 1 and no light emission is observed from a deep level. In contrast, in the case of Control a wider light emission spectrum is observed with a peak emerging in the neighborhood of 600 nm, which is observable by the naked eye as a yellow color emission.

Figure 4:
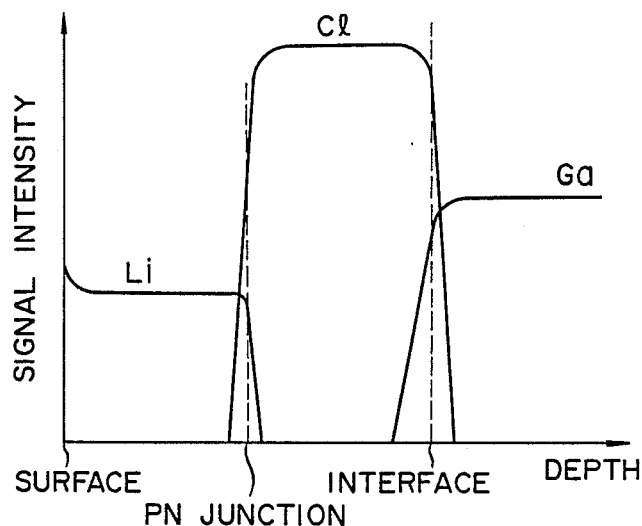
FIG. 4 is a graph showing an impurity distribution upon a SIMS analysis of the light-emitting device of FIG. 1.

FIG. 4 shows the result of measurement of an element analysis by a SIMS (secondary ion mass spectrometry) for the device of Example 1. From FIG. 4 it is found that the diffusion of Ga in the substrate into the grown layer is suppressed and that an abrupt impurity distribution is produced at the pn junction interface.

Where Al (Group III element) was used as an n type impurity, the diffusion of Al into p type layer was observed, and hence a better diode characteristic was not obtained. Where as a p type impurity use was made of As in Group V elements which can be introduced in a vapor phase, the diffusion of As into the n type layer was observed in the growth of the n type layer, and hence no better diode characteristic was obtained.

As set forth above, the n type ZnSSe crystal layer containing the Group VII element and p type ZnSSe crystal layer containing the Group I element were grown, in that order, on the n type GaAs crystal layer to obtain a blue light emitting device of excellent characteristics.

Where the Group VII element is used as the n type impurity, the conductivity type, as well as the suppression of the Zn vacancy, which is important to the blue light emission, are effectively performed. This will be explained below based on the experimental data. In accordance with the MOCVD method, the composition of the grown crystal is stoichiometrically controlled by varying the composition of a feed gas. The suppression of the Zn vacancy now under consideration is effectively achieved by performing a crystal growth under an excess Zn condition. Here the excess Zn condition means a feed gas supply range within which the growth rate is governed by that amount of feed gas of the Group VI element supplied.

Figure 6:
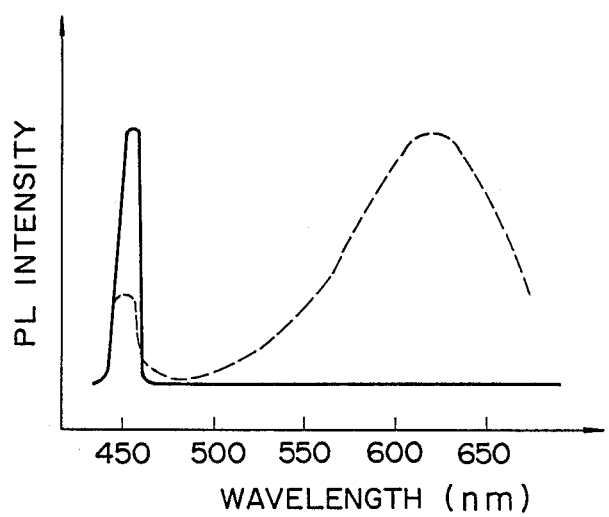
FIG. 6 is a graph showing the photoluminescence (PL) emission spectrum of a Cl-doped n type ZnSe crystal layer.
Figure 5:
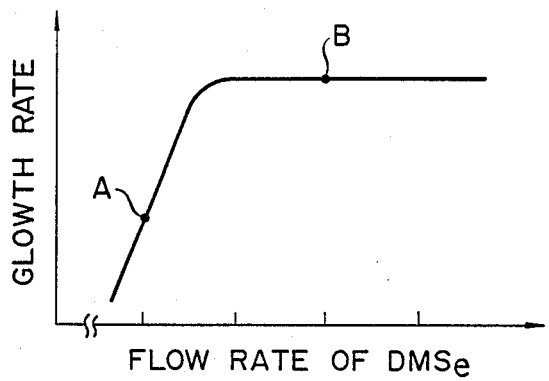
FIG. 5 is a graph showing a relation between the flow rate of dimethylselenide and the growth rate of a ZnSe crystal.

FIG. 5 is a graph showing a relation, to a growth rate, of an amount of DMSe supplied when a ZnSe crystal is grown by the MOCVD method with the supply amount of DMZn fixed. In the graph shown in FIG. 5, the point A on the curve of FIG. 5 shows the feed gas supply condition containing an excess Zn, while the point B on the curve of FIG. 5 shows the feed gas supply condition containing an excess of a Group VI material. When an n type ZnSSe crystal was group under the condition indicated by the point A in FIG. 5, the generating of the Zn vacancy is suppressed and Cl substituted on the Group VI element site effectively acts as a donor. Upon measuring the PL of the n type ZnSe crystal layer thus obtained, a sharp peak emerged in a blue emitting range as indicated by the solid line in FIG. 6. Where, on the other hand, the n type ZnSe crystal is grown under the "excess of the Group VI element" condition as indicated by the point B in FIG. 5, the generation of the Zn vacancy cannot be suppressed so that a strong SA (Self Activated) light emission emerged as orange color light, which is indicated by the dashed line in FIG. 6.

Upon measuring the PL of the Al-doped n type ZnSe crystal layer and Cl-doped n type ZnSe crystal layer, which have the same carrier concentration, it has been found that the Group VII donor is more effective than Group III donor in the suppression of the SA center because of a very low concentration of SA centers in the Cl-doped ZnSe crystal layer obtained.

Figure 7:
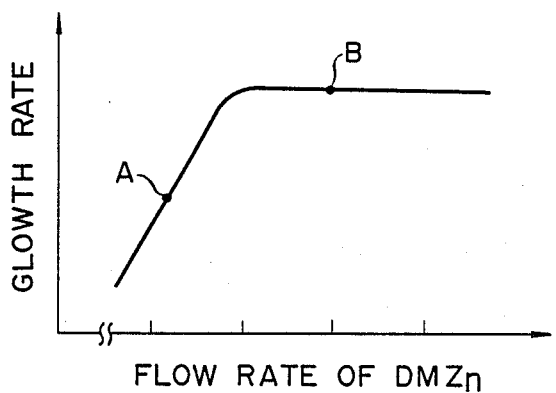
FIG. 7 is a graph showing a relation between the flow rate of dimethylzinc and the growth rate of a ZnSe crystal.
Figure 8:
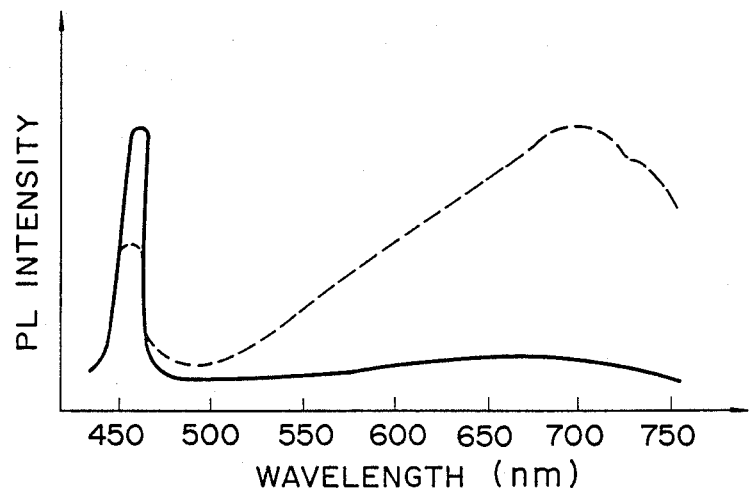
FIG. 8 is a graph showing a PL emission spectrum of an Li-doped p type ZnSe crystal layer.

In the growth of the p type crystal layer, the most important problem is the suppression of the generation of the Group VI vacancy. It is shown that this problem is settled effectively to form a crystal layer under the "excess of the Group VI element" condition. FIG. 7 is a graph showing a relation of amount of DMZn to the growth rate when an amount of DMSe supplied is fixed. The excess of the Group VI element, that is Se, is observed under the condition as indicated by the point A in FIG. 7, where the vacancy of the Group VI element is suppressed and thus lithium substituted on the site of the Group II element effectively acts as an acceptor. As a result, the PL of the ZnSe crystal thus obtained is such that a sharp peak emerges in a blue emitting wavelength range as indicated by the solid line in FIG. 8. Under the "excess of the Group II element" condition, on the other hand, Se vacancies are liable to be generated and a p type ZnSe crystal thus obtained reveals a PL as indicated by the broken line in FIG. 8 with a peak emerging in a red emitting wavelength range.

When arsenic is used as an acceptor impurity to allow it to be substituted on the site of the Group VI element, then red emission light becomes dominant if the ratio of As to Se supplied is of the order of $10^{-4}$. If the amount of Se supplied is increased, then it is necessary to increase the amount of As supplied, so that the crystallinity of the growth layer becomes poor due to the acceleration of a secondary reaction involved.

EXAMPLE 2

In Example 2, helium was employed as a carrier gas for carrying t-BuLi into a reaction chamber.

Figure 9:
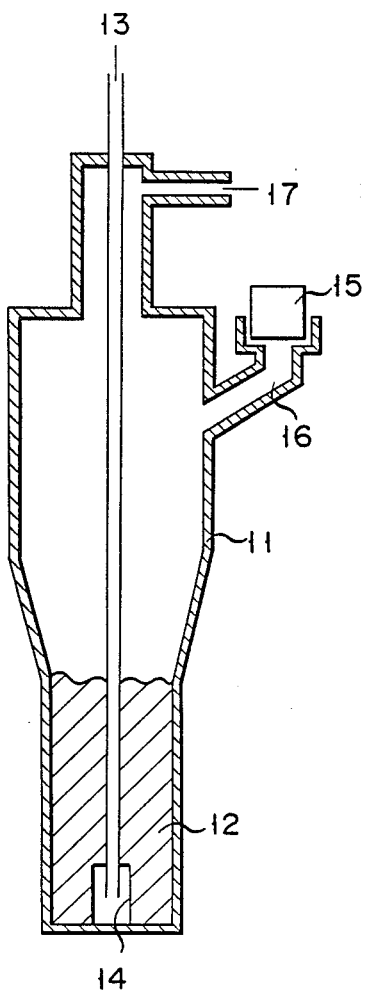
FIG. 9 is a view for showing an apparatus for supplying t-butyllithium to a reaction chamber.

FIG. 9 shows an apparatus for transporting the carrier gas containing sublimated t-BuLi to the reaction chamber. In the apparatus shown in FIG. 9, t-BuLi 12, which is solid at room temperature, is contained at the lower portion of container 11 whose feed inlet 16 is usually closed by cover 15. Helium carrier gas is introduced from inlet 13 into t-BuLi 12 through filter 14 which is provided at the lower portion of container 11. The solid-phase t-BuLi is sublimed in the helium gas and carried by the carrier gas into a reaction chamber, not shown in FIG. 9, through outlet 17. The transport rate of t-BuLi into the reaction chamber can be performed by controlling the temperature of t-BuLi, that is, the temperature of container 11, and the flow rate of the carrier gas. The t-BuLi supplied into the reaction chamber is decomposed above a heated substrate, so that lithium is doped into a ZnSe crystal. In this connection it is to be noted that DMZn and DMSe can be entrained with $H_2$ employed as the carrier gas as in the usual method since they never react with $H_2$ carrier gas.

Figure 10:
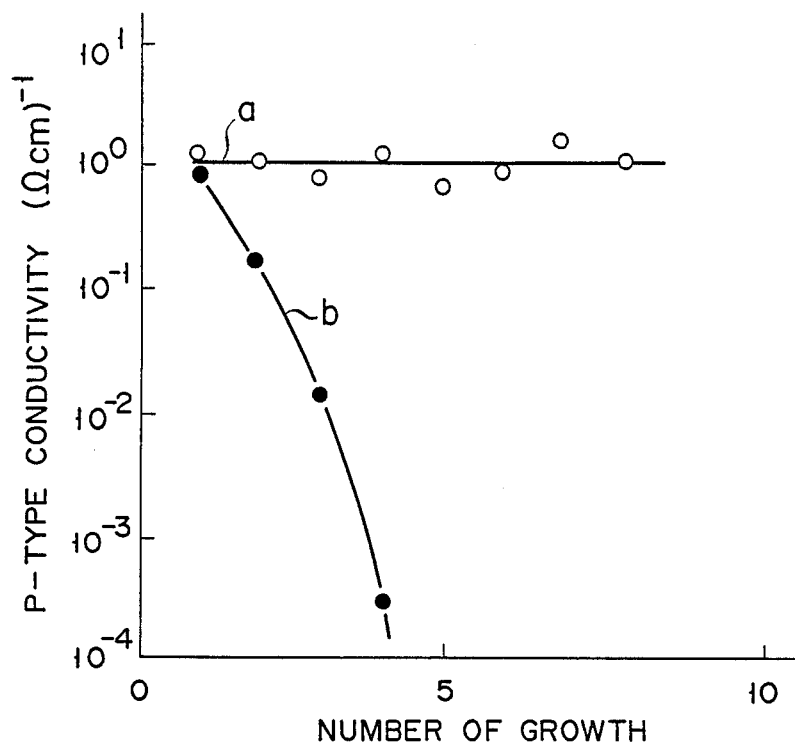
FIG. 10 is a graph showing a relation between the number of crystal growths and the conductivity of p-type ZnSe.

In MOCVD process, a crystal layer was grown on a GaAs substrate at 500° C. with the flow rates of DMZn, DMSe and t-BuLi being 3.2 umol/min., 960 umol/min and 1 μmol/min, respectively. Therefore, a p type ZnSe epitaxial crystal having a high conductivity of 1 $(\Omega cm)^{-1}$ as indicated by the curve a in FIG. 10 was able to be obtained with good reproducibility.

The same experiment as in Example 1 was conducted with the $H_2$ gas as the t-BuLi carrier gas. As evident from the curve b in FIG. 10, the conductivity of the crystal was decreased as the number of crystal growth steps was increased. The n type high resistivity crystal was obtained after the completion of five or more crystal growth steps. This is because the amount of lithium incorporated into the ZnSe layer becomes lower owing to the decomposition of t-BuLi through a reaction of t-BuLi with $H_2$ and low vapor pressure of formed compounds.

What is claimed is:

1. A semiconductor light emitting device comprising an n-type GaAs semiconductor substrate, an n type $ZnS_xSe_{1-x}$ crystal layer $(0<x<1)$ grown on the substrate and containing a Group VII element as a donor impurity, and a p type $ZnS_ySe_{1-y}$ $(0<y<1)$ crystal layer grown on the n type crystal layer and containing a Group I element as an acceptor impurity, wherein a pn junction is formed between the n type $ZnSe_xSe_{1-x}$ crystal layer and the p type $ZnS_ySe_{1-y}$ crystal layer.

2. A semiconductor light emitting device according to claim 1, wherein said Group VII element is one selected from the group consisting of chlorine, bromine, and iodine.

3. A semiconductor light emitting device according to claim 1, wherein said Group I element is one selected from the group consisting of sodium, lithium, and potassium.

4. A semiconductor light emitting device according to claim 1, wherein x in said n type $ZnS_xSe_{1-x}$ is 0 to 0.15.

5. A semiconductor light emitting device according to claim 1, wherein y in said p type $ZnS_ySe_{1-y}$ is 0 to 0.25.

* * * * *